US011914928B2

(12) United States Patent
Jovanovic

(10) Patent No.: US 11,914,928 B2
(45) Date of Patent: *Feb. 27, 2024

(54) METHOD FOR MOVING AND ALIGNING 3D OBJECTS IN A PLANE WITHIN THE 2D ENVIRONMENT

(71) Applicant: West Texas Technology Partners, LLC, Waco, TX (US)

(72) Inventor: Milos Jovanovic, Portland, OR (US)

(73) Assignee: West Texas Technology Partners, LLC, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/751,632

(22) Filed: May 23, 2022

(65) Prior Publication Data
US 2022/0284137 A1    Sep. 8, 2022

Related U.S. Application Data

(63) Continuation of application No. 17/095,734, filed on Nov. 11, 2020, now Pat. No. 11,341,290, which is a continuation of application No. 16/372,286, filed on Apr. 1, 2019, now Pat. No. 10,867,080, which is a
(Continued)

(51) Int. Cl.
| | | |
|---|---|---|
| *G06T 15/10* | (2011.01) | |
| *G06F 30/00* | (2020.01) | |
| *G06F 30/13* | (2020.01) | |
| *G06F 3/04815* | (2022.01) | |
| *G06F 3/04845* | (2022.01) | |
| *G06F 3/0486* | (2013.01) | |
| *G06F 3/0488* | (2022.01) | |
| *G06T 13/20* | (2011.01) | |
| *G06T 15/20* | (2011.01) | |

(Continued)

(52) U.S. Cl.
CPC ............ *G06F 30/00* (2020.01); *G06F 3/0486* (2013.01); *G06F 3/0488* (2013.01); *G06F 3/04815* (2013.01); *G06F 3/04845* (2013.01); *G06F 30/13* (2020.01); *G06T 13/205* (2013.01); *G06T 15/10* (2013.01); *G06T 15/20* (2013.01); *G06T 19/006* (2013.01); *G06T 19/20* (2013.01); *G06F 2203/04802* (2013.01); *G06T 2215/12* (2013.01); *G06T 2215/16* (2013.01); *G06T 2219/004* (2013.01); *G06T 2219/008* (2013.01); *G06T 2219/012* (2013.01); *G06T 2219/2004* (2013.01); *G06T 2219/2008* (2013.01); *G06T 2219/2012* (2013.01); *G06T 2219/2016* (2013.01); *G06T 2219/2024* (2013.01)

(58) Field of Classification Search
CPC ....... G06T 15/506; G06T 15/50; G06T 15/80; G06T 15/60; G06T 15/06
USPC .......................................................... 345/427
See application file for complete search history.

(56) References Cited

U.S. PATENT DOCUMENTS

| | | |
|---|---|---|
| 7,043,695 B2 | 5/2006 | Elber et al. |
| 7,062,722 B1 | 6/2006 | Carlin et al. |
| 7,277,572 B2 | 10/2007 | MacInnes et al. |

(Continued)

*Primary Examiner* — Gordon G Liu
(74) *Attorney, Agent, or Firm* — Cadwalader, Wickersham & Taft LLP

(57) ABSTRACT

Example systems and methods for virtual visualization of a three-dimensional model of an object in a two-dimensional environment. The method may include moving and aligning the three-dimensional model of the object along a plane in the two-dimensional environment.

20 Claims, 10 Drawing Sheets

Related U.S. Application Data continuation of application No. 14/710,561, filed on May 12, 2015, now Pat. No. 10,296,663.

(60) Provisional application No. 61/992,629, filed on May 13, 2014, provisional application No. 61/992,746, filed on May 13, 2014, provisional application No. 61/992,759, filed on May 13, 2014, provisional application No. 61/992,719, filed on May 13, 2014, provisional application No. 61/992,665, filed on May 13, 2014, provisional application No. 61/992,774, filed on May 13, 2014.

(51) Int. Cl.
*G06T 19/00* (2011.01)
*G06T 19/20* (2011.01)

(56) References Cited

U.S. PATENT DOCUMENTS

| | | |
|---|---|---|
| 7,425,958 B2 | 9/2008 | Berger et al. |
| 7,523,411 B2 | 4/2009 | Carlin |
| 7,583,275 B2 | 9/2009 | Neumann et al. |
| 8,935,328 B2 | 1/2015 | Tumuluri |
| 9,092,053 B2 | 7/2015 | Kerr et al. |
| 9,129,433 B1 | 9/2015 | Korobkin |
| 9,317,959 B2 | 4/2016 | Densham |
| 9,317,962 B2 | 4/2016 | Morato et al. |
| 9,324,190 B2 | 4/2016 | Bell et al. |
| 9,330,503 B2 | 5/2016 | Mital et al. |
| 9,514,573 B2 | 12/2016 | Grimaud |
| 2004/0105573 A1 | 6/2004 | Neumann et al. |
| 2005/0002662 A1 | 1/2005 | Arpa et al. |
| 2007/0098290 A1 | 5/2007 | Wells |
| 2007/0124215 A1 | 5/2007 | Simmons, Jr. |
| 2009/0079740 A1 | 3/2009 | Fitzmaurice et al. |
| 2009/0113349 A1 | 4/2009 | Zohar et al. |
| 2009/0125801 A1 | 5/2009 | Algreatly |
| 2009/0243957 A1 | 10/2009 | Ni et al. |
| 2009/0254843 A1 | 10/2009 | Van Wie et al. |
| 2010/0188397 A1 | 7/2010 | Tsai et al. |
| 2010/0208033 A1 | 8/2010 | Edge et al. |
| 2010/0289817 A1 | 11/2010 | Meier et al. |
| 2010/0325578 A1* | 12/2010 | Mital ............... G06T 19/20 715/823 |
| 2012/0086727 A1 | 4/2012 | Korah et al. |
| 2012/0120113 A1 | 5/2012 | Hueso |
| 2012/0169847 A1 | 7/2012 | Lee et al. |
| 2012/0182286 A1 | 7/2012 | Wang |
| 2012/0183204 A1 | 7/2012 | Aarts et al. |
| 2013/0002649 A1 | 1/2013 | Wu et al. |
| 2013/0135303 A1 | 5/2013 | Densham |
| 2013/0141428 A1* | 6/2013 | Gipson ............ G06F 3/04815 345/419 |
| 2013/0187905 A1 | 7/2013 | Vaddadi et al. |
| 2013/0212538 A1 | 8/2013 | Lemire et al. |
| 2013/0326583 A1 | 12/2013 | Freihold et al. |
| 2014/0043436 A1* | 2/2014 | Bell ............... H04N 13/204 348/46 |
| 2014/0176537 A1 | 6/2014 | Densham |
| 2015/0062125 A1 | 3/2015 | Aguilera Perez et al. |
| 2015/0170260 A1 | 6/2015 | Lees et al. |
| 2015/0310662 A1 | 10/2015 | Arcas et al. |
| 2015/0332504 A1 | 11/2015 | Wang et al. |
| 2015/0332505 A1 | 11/2015 | Wang et al. |

\* cited by examiner

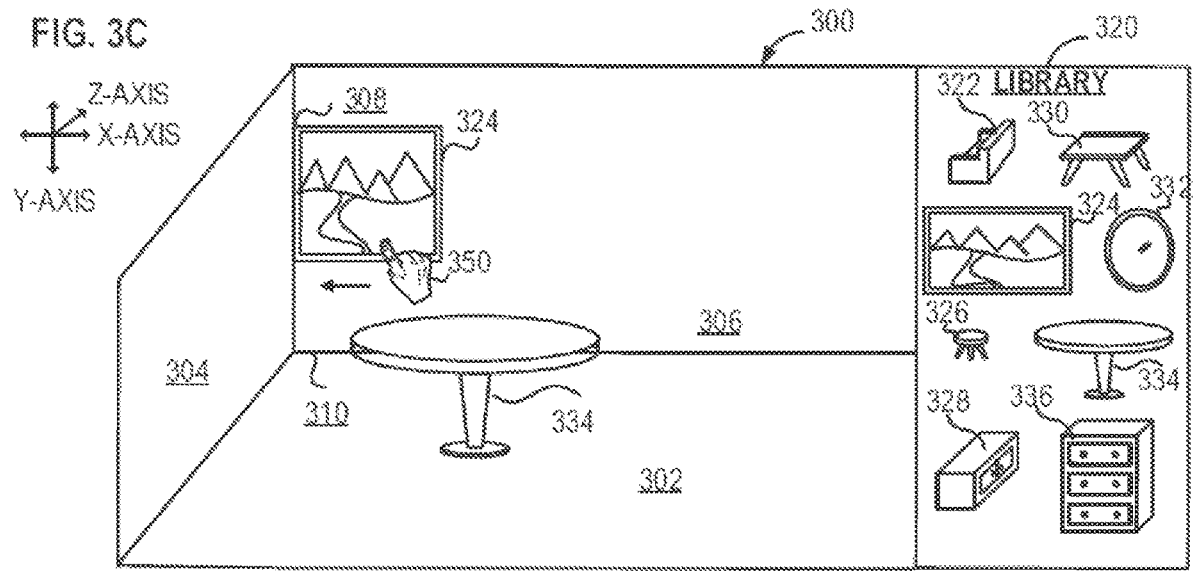
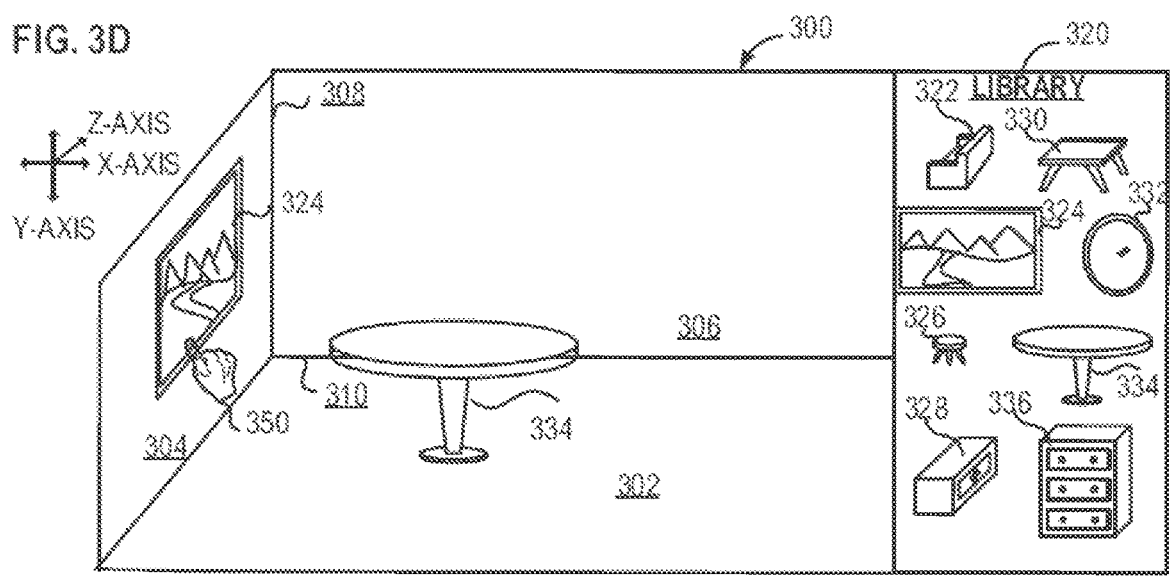

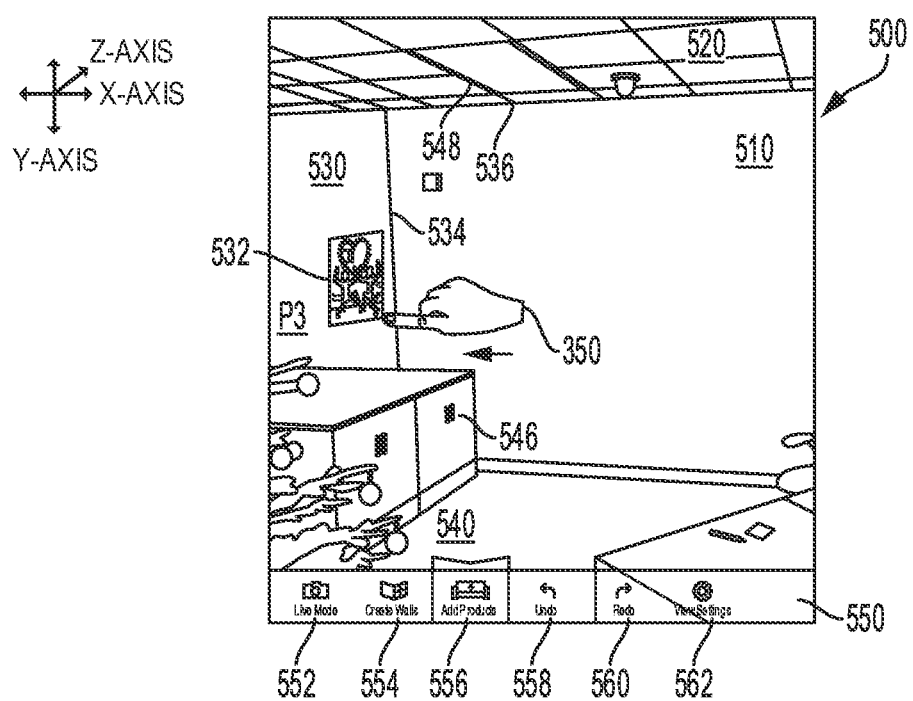

METHOD FOR MOVING AND ALIGNING 3D OBJECTS IN A PLANE WITHIN THE 2D ENVIRONMENT

CROSS-REFERENCE TO RELATED APPLICATIONS

The present application is a continuation of co-pending U.S. Non-Provisional patent application Ser. No. 17/095,734, entitled "METHOD FOR MOVING AND ALIGNING 3D OBJECTS IN A PLANE WITHIN THE 2D ENVIRONMENT" and filed on Nov. 11, 2020, which is a continuation of U.S. Non-Provisional patent application Ser. No. 16/372,286, entitled "METHOD FOR MOVING AND ALIGNING 3D OBJECTS IN A PLANE WITHIN THE 2D ENVIRONMENT," and filed on Apr. 1, 2019, which is a continuation of and was with U.S. Pat. No. 10,296,663 (i.e. the '663 patent), entitled "METHOD FOR MOVING AND ALIGNING 3D OBJECTS IN A PLANE WITHIN THE 2D ENVIRONMENT," and filed on May 12, 2015. The '663 patent claims priority to U.S. Provisional Patent Application No. 61/992,759 entitled "METHOD FOR FORMING WALLS TO ALIGN 3D OBJECTS IN 2D ENVIRONMENT", filed on May 13, 2014. The '663 patent claims further priority to U.S. Provisional Patent Application No. 61/992,629 entitled "METHOD FOR PROVIDING SCALE TO ALIGN 3D OBJECTS IN 2D ENVIRONMENT", filed on May 13, 2014. The '663 patent claims further priority to U.S. Provisional Patent Application No. 61/992,719 entitled "METHOD FOR PROVIDING A PROJECTION TO ALIGN 3D OBJECTS IN 2D ENVIRONMENT", filed May 13, 2014. The '663 patent claims further priority to U.S. Provisional Patent Application No. 61/992,774 entitled "METHOD FOR MOVING AND ALIGNING 3D OBJECTS IN A PLANE WITHIN THE 2D ENVIRONMENT", filed May 13, 2014. The '663 patent claims further priority to U.S. Provisional Patent Application No. 61/992,746 entitled "METHOD FOR REPLACING 3D OBJECTS IN 2D ENVIRONMENT", filed May 13, 2014. The '663 patent claims further priority to U.S. Provisional Patent Application No. 61/992,665 entitled "METHOD FOR INTERACTIVE CATALOG FOR 3D OBJECTS WITHIN THE 2D ENVIRONMENT", filed May 13, 2014. The entire contents of each of the above-listed applications are hereby incorporated by reference for all purposes.

BACKGROUND AND SUMMARY

Interior design may involve developing and evaluating a design for a room or environment. For example, a designer may wish to position various objects, including furniture, lighting fixtures, and wall hangings, within a 2D environment of an interior room. Conventional interior design tools may enable a user to position objects by selecting an object, and "dragging and dropping" the object to a location in the 2D environment using a mouse, keyboard or other input device.

The inventors herein have recognized various issues with the above methods. Namely, although objects may be positioned independently within a 2D environment, it may be difficult to precisely move and align an object in the 2D environment. For example, a user may want to place a wall art in the 2D environment. Using conventional methods, the user may manually position the wall art on a wall plane within the 2D environment. However, if the user decides to move over the wall art to a ceiling plane, the wall art may be positioned inaccurately.

One approach that at least partially addresses the above issues may include a method for placing and moving an object in the 2D environment, comprising of the knowledge of the plane to which the 3D object may be restricted. A method may comprise of selecting the 3D object along with the information if the 3D object is a wall object or a ground plane (e.g. floor plane) object or a top plane (e.g. ceiling plane) object.

In another embodiment, a method for placing objects in the 2D environment may comprise moving the 3D object along a plane. The user may be unaware while moving the 3D object from one plane to another, that the plane to which the 3D object is being moved may not be configured to accommodate the 3D object. For example, while moving a wall mirror to a satisfactory position within the 2D environment, the user may begin to move the wall mirror to a ceiling plane in the 2D environment. The method and system discussed herein may prevent such maneuvers.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIGS. 3A, 3B, 3C and 3D are example representations of a 2D environment.

FIGS. 4A, 4B and 4C are example representations of another 2D environment

DETAILED DESCRIPTION

Figure 1A:
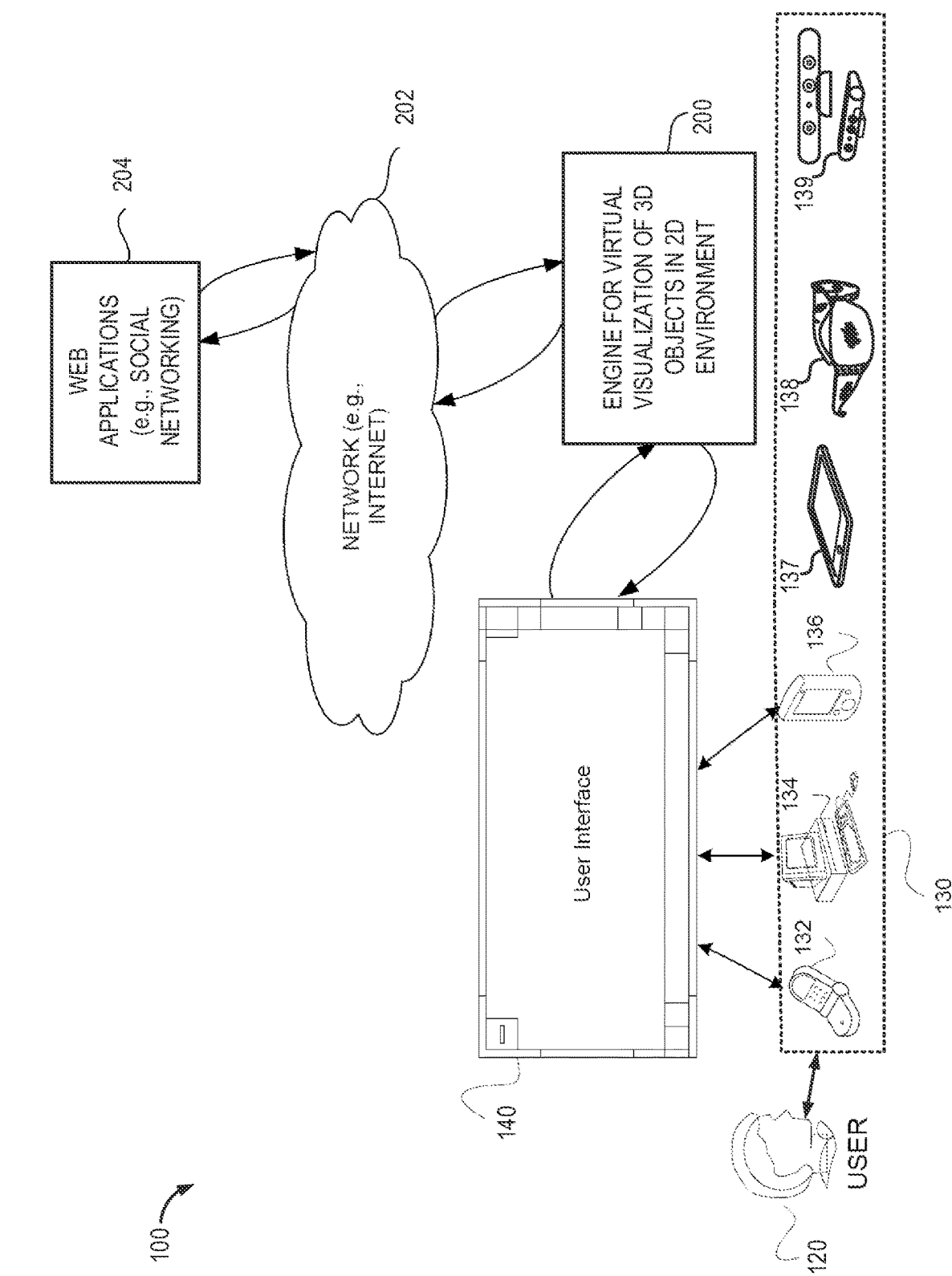
FIG. 1A is a block diagram illustrating the overall system for visualization of 3D models of objects in a 2D environment, in accordance with various embodiments.

The present description relates to visualization and adding of 3D models of objects to a 2D environment, wherein the 2D environment is a real environment represented by a photo or video. A user may import photographic images, digital images, video images, and other graphical representations of the 2D environment. Further, the 2D environment may include existing graphical materials or graphical materials captured as a still image or a live feed image. The 2D environment may serve as the background environment for adding a 3D model of an object.

The 3D object is associated with object information data, which includes a defined set of parameters relevant to the 3D object. The parameters may include attributes, instructions, and other such scripts associated and essential for graphical use of the 3D object. Characteristics of the 3D object, interaction between object entities may be analyzed with such associated data. The object information data associated with the 3D object may include geometric attributes, depth value, color value, and such other properties. For example, geometric attributes of the 3D object, such as a chair, may include height and width information. If a user decides to place the chair near a table, already present in the 2D environment, the height and width information for the chair may help the user in precise aligning.

The object information data may also include metadata encoding one or more of a set of parameters relevant to the 3D object, manufacturer's guidelines, regulations and guidelines governing the 3D object, safety guidelines for the 3D object, and any other relevant information specific to the 3D object.

The object information data may include metadata defining the behavior of the 3D object within the 2D environment. For example, a 3D object may include metadata defining an object as one of a wall object, ceiling object, floor object, or combination thereof. The metadata may further define the placement and movement of the object within the environment.

The object information data may also include metadata encoding an information tag. The information tag may include a description of the 3D object including dimensions, materials, cost, manufacturer, and other information specific to the 3D object discussed below.

The object information data may also include metadata encoding graphical data, spatial data, and other rendering data for superimposing the 3D object within the 2D environment. Graphical, spatial, and rendering data may be processed by a computing device to generate and display the 3D object to the user.

The parameters may include attributes, instructions, behavior characteristics, visualizations to be displayed by the 3D object, and other such scripts associated and essential for graphical use of the 3D object. For example, the parameters may include, but are not limited to, the physical dimensions of the 3D object, mounting requirements for the 3D object, metadata identifying the 3D object as a floor object, wall object, ceiling object, or combination thereof, power requirements, length of a power cord, and any other relevant information describing the 3D object.

Additionally, the object information data may include additional parameters such as manufacturer's guidelines and/or safety guidelines for safe and proper installation and operation of the 3D object. For example, the object information data may include metadata encoding a minimum clearance or spatial requirement surrounding the 3D object. The minimum clearance/spatial requirement may be required for adequate ventilation of the 3D object, prevention of fire hazards, noise control, clearance of moving parts of the 3D object, or to satisfy any other personal safety, medical safety, or industrial safety standard. As an example, a display may require 6 inches clear from the cooling fan gratings to allow for proper airflow to cool the electric internals within the display. As another example, in a medical application, a magnetic resonance imager may generate an electro-magnetic field in an area surrounding the magnetic resonance imager that may interfere with other electrically powered or magnetically sensitive medical equipment, personal medical equipment such as a pacemaker, and any magnetic material that may be drawn to the magnetic resonance imager by magnetic attraction. In an industrial application, some industrial equipment have moving or rotating parts that may extend past the main body of the piece of industrial equipment. Therefore, to allow for proper operation of the industrial equipment, other equipment or objects may be located outside a minimum clearance or spatial requirement surrounding the piece of industrial equipment.

In another example, in a restaurant environment, the tables, chairs, and other objects within the restaurant space may be required to be arranged such that a minimum clearance surrounding each object is maintained and that pathways for traversal are maintained clear and of sufficient dimensions to meet federal and local accommodation codes. Therefore, each chair and each table may include a minimum clearance or spatial requirement surrounding the table or chair to meet the governing guidelines.

In another example, in a retail environment, retail display fixtures may be arranged within the retail space such that a minimum clearance surrounding each fixture may be maintained to allow shoppers to easily move within the retail space and to meet federal and local accommodation codes. In addition to satisfaction of the governing access codes, the 3D models of the display fixtures and accompanying merchandise may be arranged within the 2D image of the retail space allowing retail planners to efficiently design retail merchandising plans, design retail exhibit plans, and then electronically distribute the design plans to the stores. Further, the retail merchandising teams at the stores may propose amendments to the design plans that are specific to the available retail space within the store accounting for differences due to the specific architectural design of the store space. These amendments may then be reviewed and approved by the retail planners, thereby providing an advantage of an efficient and electronic means of distributing, amending, and approving retail merchandising plans.

The object information data may be provided by multiple sources, including but not limited to, one or more of the manufacturer of the 3D object, government safety regulations such as provided by the Occupational Safety and Health Administration or other Federal or local governing body, federal and local accommodation codes such as the Americans with Disabilities Act and federal, state, and local fire codes, the user may provide the object information data, object information data may be downloaded from a remote data base, encoded by an asset manager or managing service providing the 3D objects, or any other suitable means. It will be appreciated that the listed sources of object information data are not intended to be limiting.

In some embodiments, the object information data may include one or more spatial requirements. The spatial requirements may exceed the geometric dimensions of the 3D object and govern interactions between the 3D object and other object entities. The spatial requirements of a 3D object may be specific to the object based upon one or more of a manufacturer's recommendation, imported from a remote database, government regulation, configured by the user, or any other suitable source.

In some embodiments, the two-dimensional environment may also include environmental information data. The environmental information data may include metadata which may encode one or more of a set of properties relevant to the 2D environment, regulations and guidelines governing the 2D environment such as governing access regulations, industrial safety standards, and governing fire codes, safety guidelines for the 2D environment, and any other relevant information specific to the 2D environment. The properties encoded by environmental information data may include one or more of the dimensions of the 2D environment, characteristics of the 2D environment governing the behavior and movement of 3D objects within the 2D environment, locations of power supplies and the voltage and frequency supplied, construction information such as location of load bearing members, allowable load information, construction materials, available ventilation, acoustic information, fixed lighting sources, and any other information relevant to the two-dimensional environment.

The environmental information data may be provided by multiple sources such as one or more of government safety regulations such as provided by the Occupational Safety and Health Administration or other Federal or local governing body, federal and local accommodation codes such as the Americans with Disabilities Act and federal, state, and local fire codes, the user may provide the object information data, object information data may be downloaded from a remote data base, encoded by an asset manager or managing service providing the 3D objects, or any other suitable means.

In these embodiments properties of the 2D environment may be retrieved from the environmental information data and analyzed to determine interaction with 3D objects within the 2D environment. As a non-limiting example, one or more threshold barriers between two planes of the 2D environment may be adjusted to satisfy one or more conditions encoded in the metadata of both the environmental information data and the object information data.

In some embodiments, the physical properties of the 3D object, interaction between object entities, and interactions between object entities and the 2D environment may be analyzed with such associated data.

As the data associated with the 3D object is transferred to the 2D environment, the 3D object may be visualized in the 2D environment with respect to scale and perspective of the 2D environment. The 2D environment including the 3D object may be referred to as a modeled 2D environment.

Within the 2D environment, the user may move the 3D object in a vertical direction, horizontal direction, and in a rotational manner. The selected 3D object may be configured to be positioned in a certain plane, where the plane may be a wall plane or a ground plane (e.g., a floor plane) or a top plane (e.g., a ceiling plane). For example, if the 3D object is a wall painting, the user may move the wall painting in a vertical or horizontal manner on a wall plane of the 2D environment; whereas, if the 3D object is a chair on a ground plane of the 2D environment, the user may move the chair in a horizontal or rotational manner.

The user may move the 3D object as desired on the plane the 3D object is configured to belong. The user may prefer to move the 3D object to another plane, for example the user may prefer to position a wall object to a ceiling. In such examples, the 3D object will halt at the intersection of the two different planes and the user may not be able to move the 3D object configured to be on the wall plane to the ceiling plane. However, if the user prefers to move a wall object, such as a wall mirror, from one wall to another the wall, then the wall mirror may continue to move from one wall plane to another wall plane.

The user may save the resulting image to a personal computer (PC) or network database for future use or reference, or post the resulting image on a social network, and perform other operations on the image. Further, the user may have some previously saved images which the user may use to compare with the newly obtained images in order to select preferable combinations of a 3D object in a 2D background. The user may use his preferences before purchasing one or more 3D object for the 2D environment.

Additionally, the user may be connected to various social networking services and/or microblogs, such as Facebook™, Twitter™, and other such networking services. Connection to social networking services and/or microblogs may allow user to interact with his contacts to share and obtain opinion and feedback on image obtained after placing 3D objects in 2D environment. Further, the user may also request help from designing services to arrange 3D objects within a given 2D environment.

Visualization and addition of 3D objects to any 2D environment provides ample opportunities in various spheres of human life. Spatial representation of 3D objects may help in comprehending and learning, designing and drafting, efficient space management, and accelerated decision making and planning. The ability to represent virtual 3D objects in a real environment can provide further applications, such as selecting furniture for a house, designing kitchen cabinets, selecting display and presentation equipment for conference rooms, presentation layouts for tradeshow booths, industrial planning and industrial equipment placement, medical equipment placement, and other space and design applications.

Figure 1B:
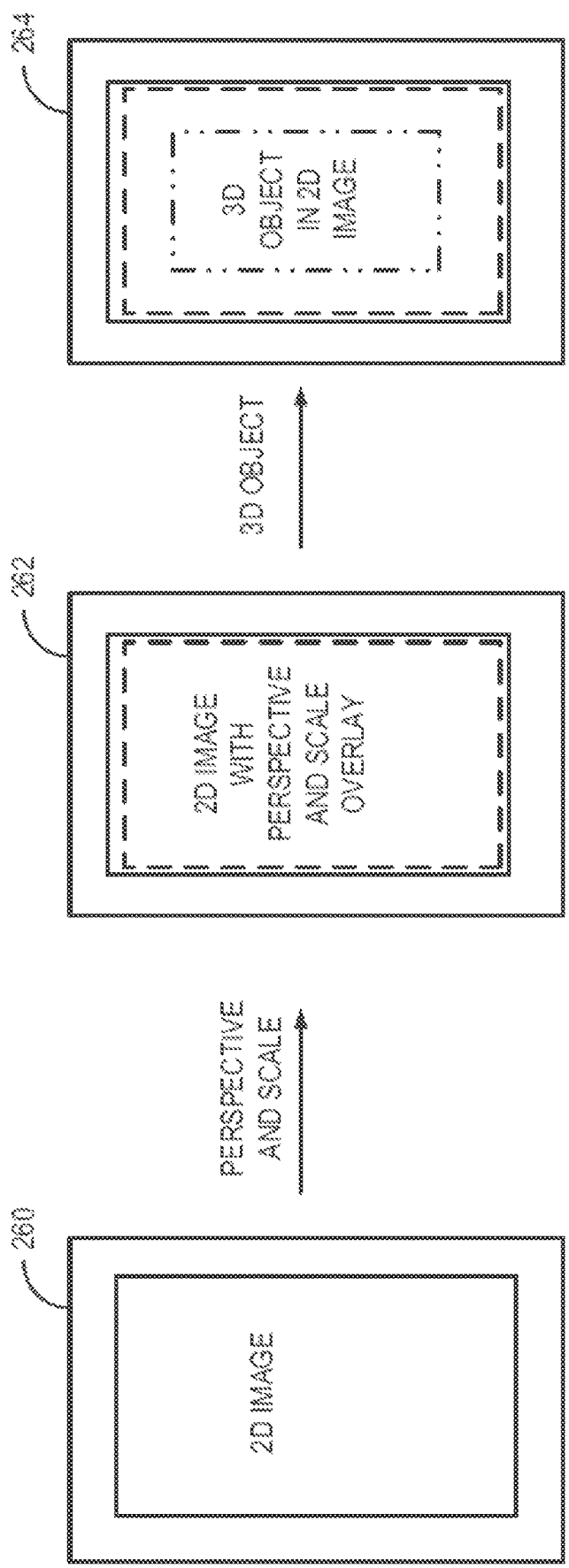
FIG. 1B is a schematic illustration of a system for visualization of 3D model of objects in a 2D environment.
Figure 2:
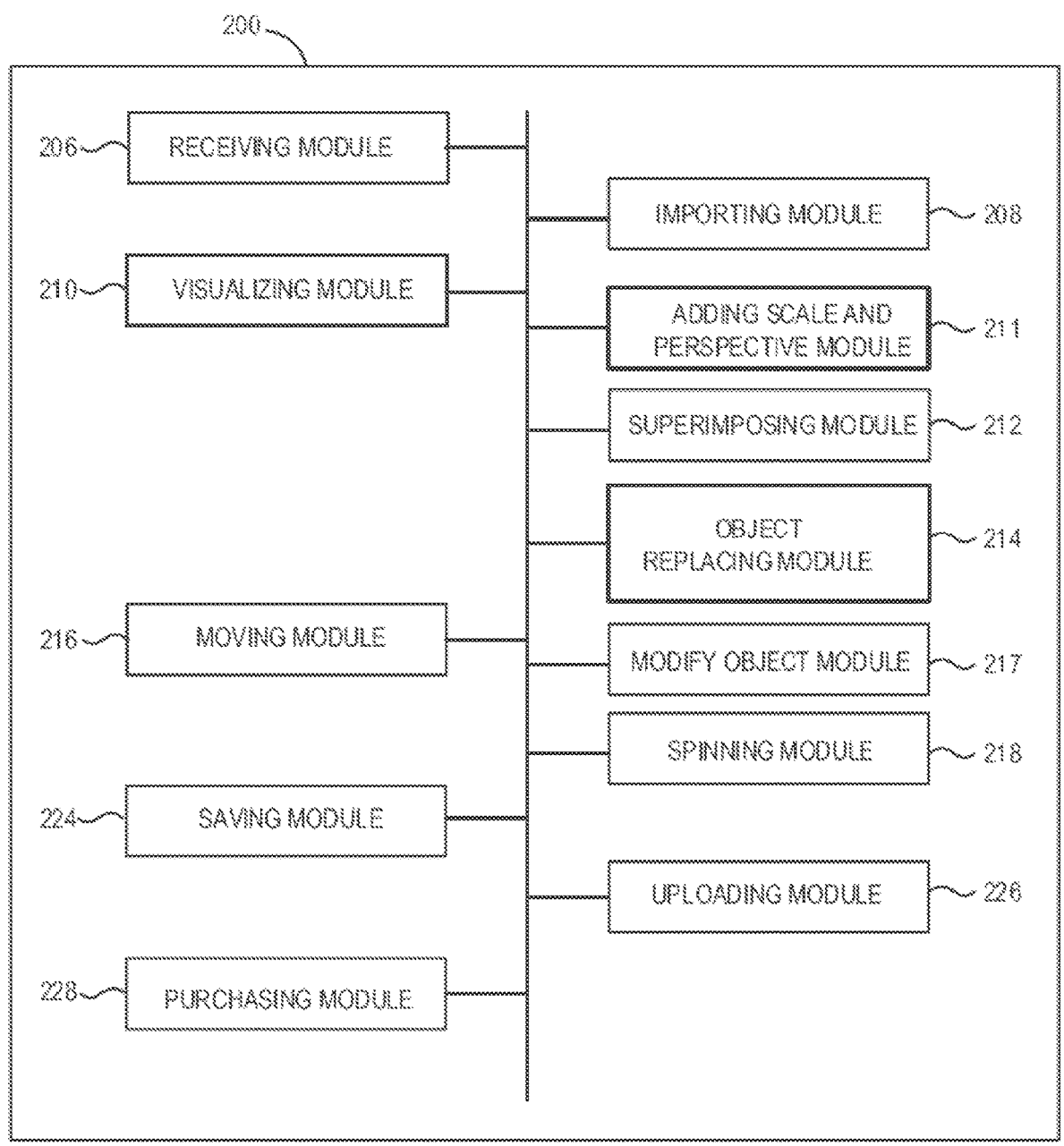
FIG. 2 is a block diagram showing various modules of an engine for visualization of 3D models of objects in a 2D environment, in accordance with various embodiments.
Figure 4A:
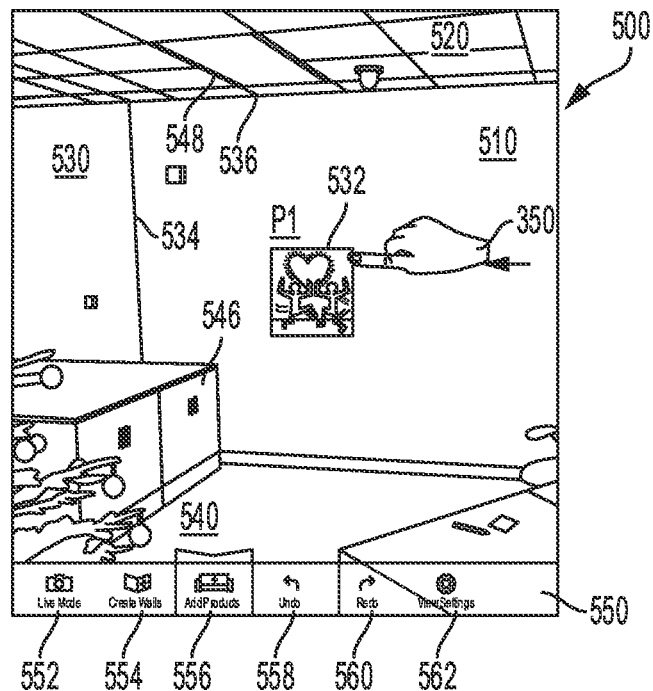
Figure 4B:
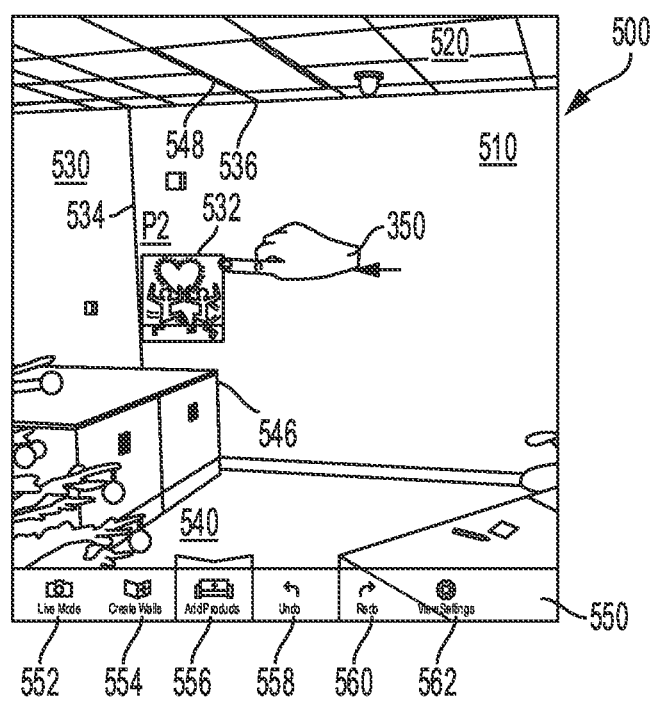
Figure 6A:
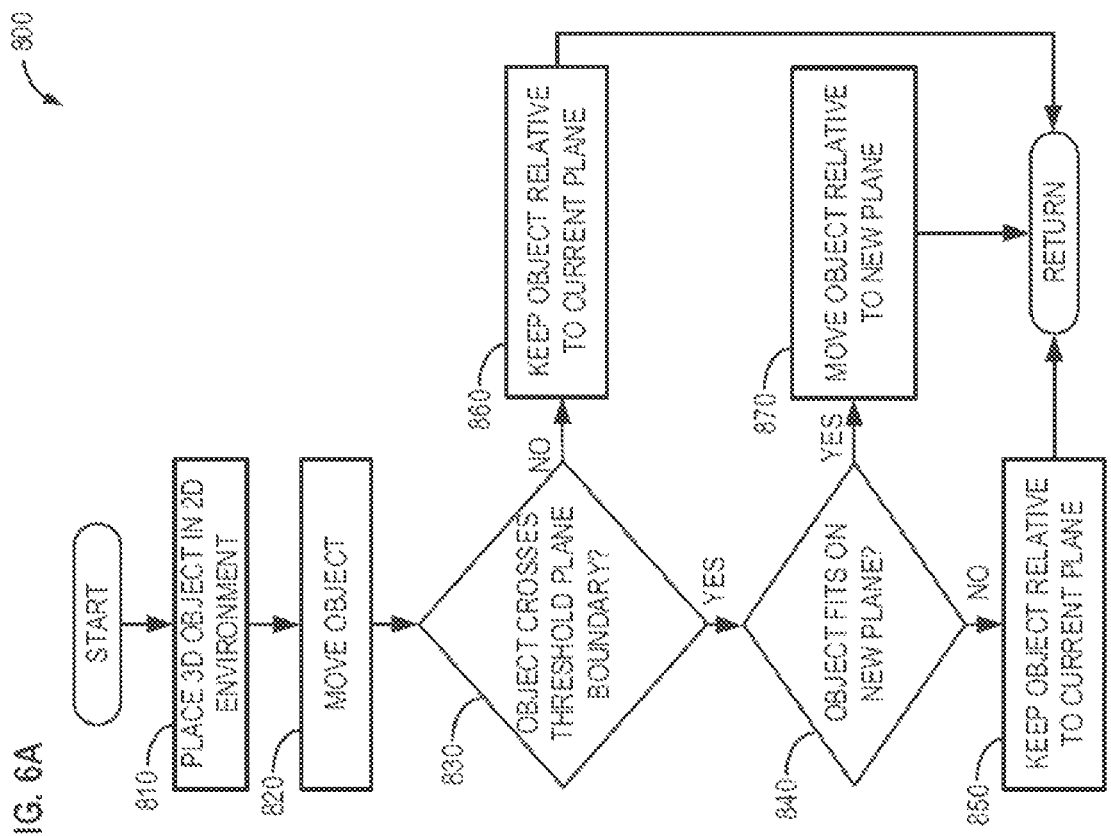
FIG. 6A is another example flowchart for placing and moving the 3D object in the 2D environment.
Figure 5:
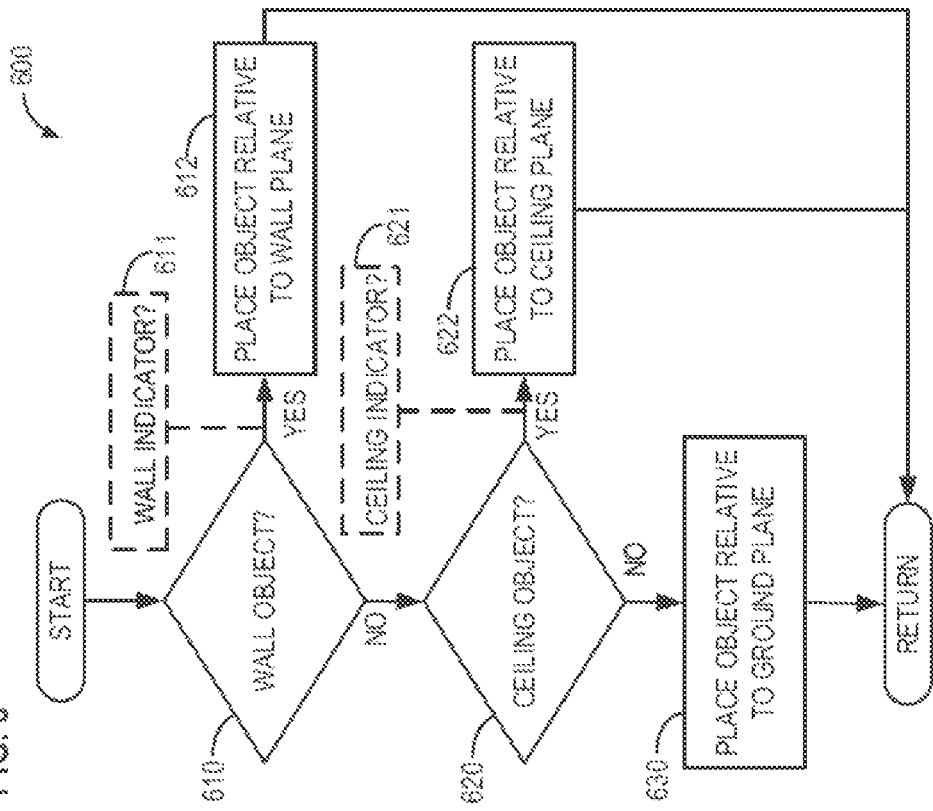
FIG. 5 is an example flowchart method for placing and moving the 3D object in the 2D environment.
Figure 6B:
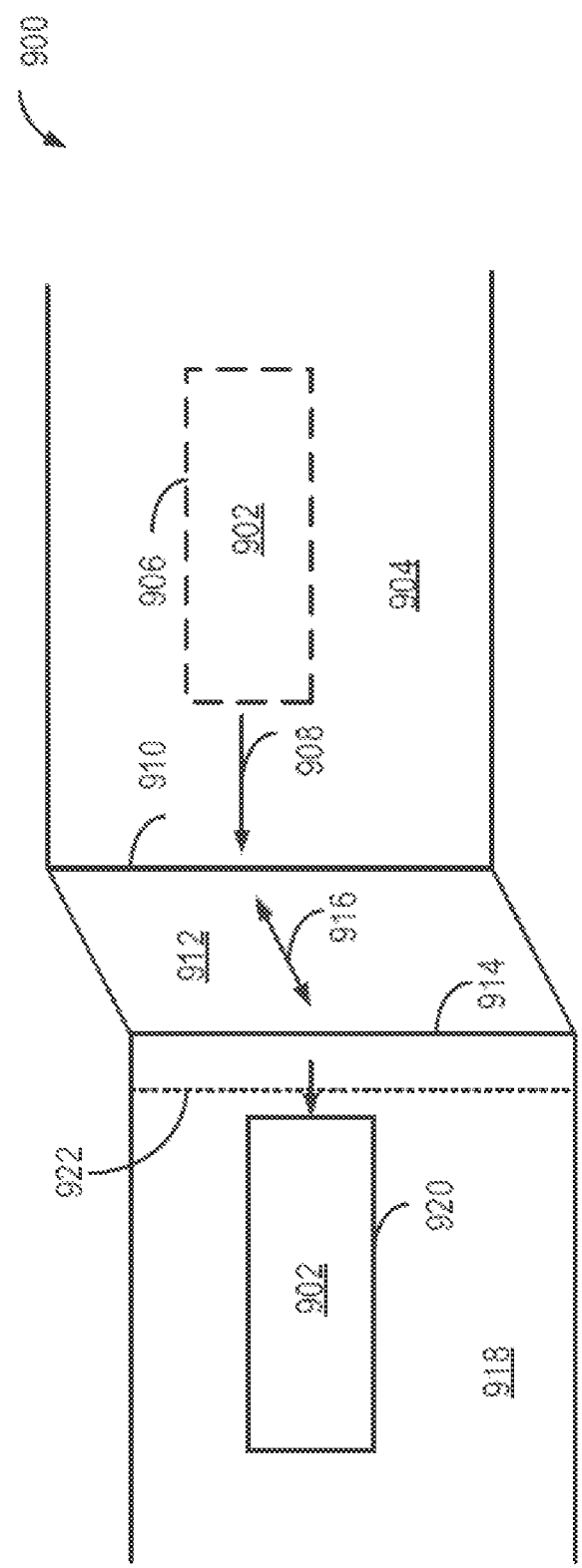
FIG. 6B is a schematic illustration of positioning of a wall object on a selected wall plane.
Figure 7:
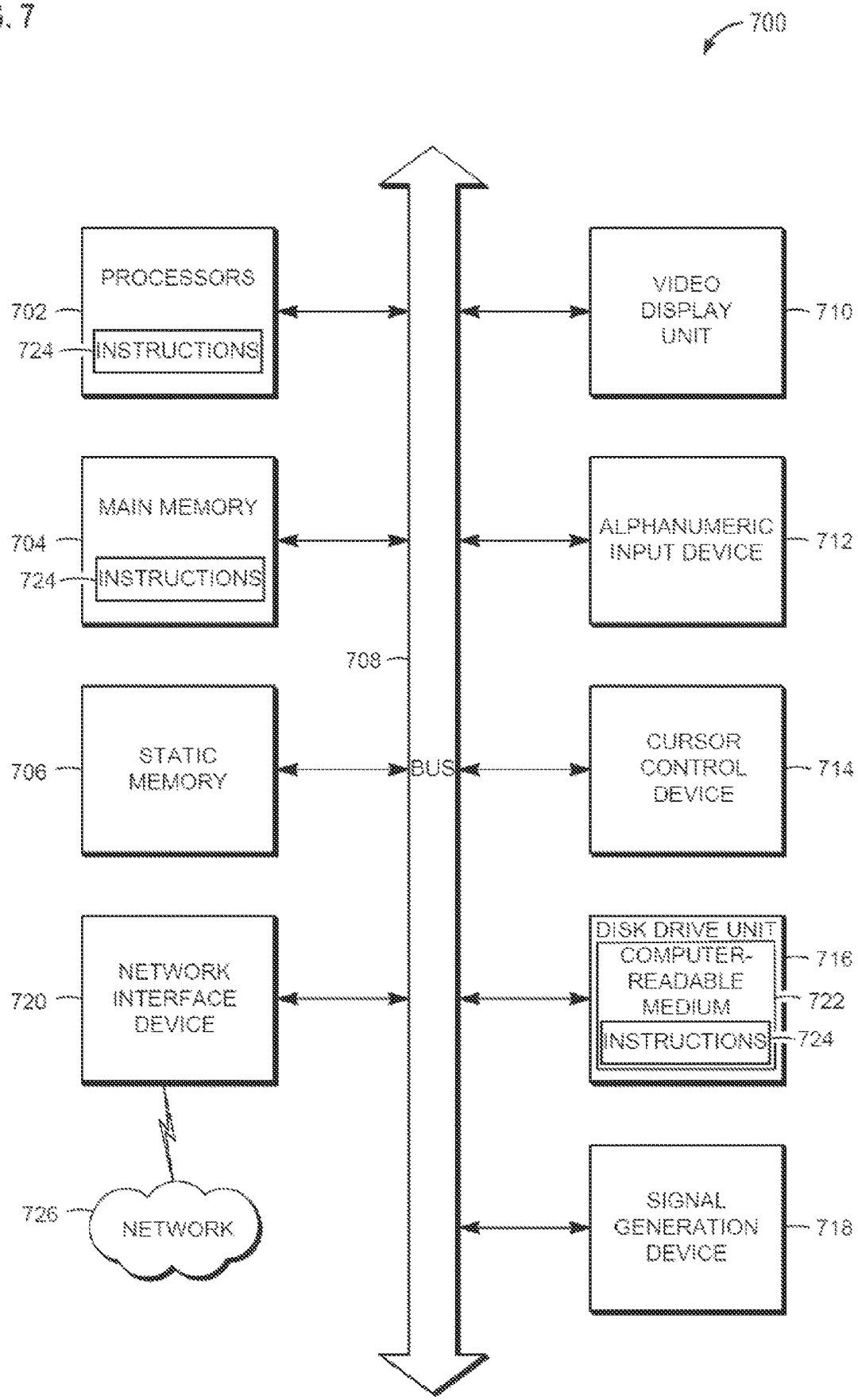
FIG. 7 illustrates an example of a computer network system, in which various embodiments may be implemented.

FIG. 1A is a block diagram illustrating the overall system for visualization of 3D models of objects in a 2D environment, in accordance with various embodiments of the present application. FIG. 1B is a schematic illustration of a system for visualization of 3D models of objects in a 2D environment. FIG. 2 is a block diagram showing various modules of an engine for visualization of 3D models of objects in the 2D environment. FIGS. 3A, 3B, 3C and 3D are example representations of the 2D environment. FIGS. 4A, 4B and 4C are example representations of another 2D environment. FIG. 5 is an example flowchart method for placing and moving the 3D object in the 2D environment. FIG. 6A is another example flowchart method for placing and moving the 3D object in the 2D environment. FIG. 6B is a schematic illustration of positioning of a wall object on a selected wall plane. FIG. 7 illustrates an example of a computer network system, in which various embodiments may be implemented.

FIG. 1A illustrates a block diagram of an overall system 100 for visualization of 3D objects in a 2D environment, in accordance with various embodiments of the present disclosure. Overall system 100 may include a user 120, user devices 130, a user interface 140, an engine 200 for virtual visualization of 3D models of objects in 2D environment, a network 202, and various web applications 204. The user devices 130 may include a mobile phone 132, a personal computer (PC) 134, a personal digital assistant (PDA) 136, a tablet PC 137, a wearable computer device 138 such as Google Glass™ and Recon Jet™, a 3D scanner 139 and the like. The user 120 via user devices 130 interacts with the user interface 140. The user may also directly interact with the user interface via touchscreen, keyboard, mouse key, touch pad and the like. The engine 200 for visualization of 3D objects in 2D environment may comprise of local device-based, network-based, or web-based service available on any of the user devices 130. The user may further interact with the web applications 204. The web applications may include social networking services.

The user 120 may interact with the user interface 140 via the user devices 130. The system for virtual visualization of 3D models of objects in 2D environment 300 may be implemented on a local device or via a network-based or web-based service accessible via user devices 130. The user 120 may periodically interact with the system for virtual visualization of 3D models of objects in 2D environment 300 via the user interface 140 displayed using one of the user devices 130. Additionally, the user 120 may periodically interact with the web application 204 such as a social networking service (including social networks, microblogs, web blogs, and other web resources) via the system for virtual visualization of 3D models of objects in 2D environment 300 and the network 110 to upload graphics obtained using the system for virtual visualization of 3D models of objects in 2D environment 300, communicate with members of the social networking service, or request help from design services, or purchase a 3D object through web applications 204.

The user devices 130, in some example embodiments, may include a Graphical User Interface (GUI) for displaying the user interface 140. In a typical GUI, instead of offering only text menus or requiring typed commands, the system 200 may present graphical icons, visual indicators, or graphical elements called widgets that may be utilized to allow the user 120 to interact with the user interface 140. The user devices 130 may be configured to utilize icons in conjunction with text, labels, or text navigation to fully represent the information and actions available to users.

The network 202 may include the Internet or any other network capable of communicating data between devices. Suitable networks may include or interface with one or more of, for instance, a local intranet, a Personal Area Network (PAN), a Local Area Network (LAN), a Wide Area Network (WAN), a Metropolitan Area Network (MAN), a virtual private network (VPN), a storage area network (SAN), an Advanced Intelligent Network (AIN) connection, a synchronous optical network (SONET) connection, Digital Subscriber Line (DSL) connection, an Ethernet connection, an Integrated Services Digital Network (ISDN) line, a cable modem, an Asynchronous Transfer Mode (ATM) connection, or an Fiber Distributed Data Interface (FDDI) or Copper Distributed Data Interface (CDDI) connection. Furthermore, communications may also include links to any of a variety of wireless networks, including Wireless Application Protocol (WAP), General Packet Radio Service (GPRS), Global System for Mobile Communication (GSM), Code Division Multiple Access (CDMA) or Time Division Multiple Access (TDMA), cellular phone networks, Global Positioning System (GPS), Cellular Digital Packet Data (CDPD), Research in Motion (RIM), limited duplex paging network, bluetooth radio, or an IEEE 802.11-based radio frequency network. The network 202 may further include or interface with any one or more of an RS-232 serial connection, an IEEE-1394 (Firewire) connection, a Fiber Channel connection, an IrDA (infrared) port, a Small Computer Systems Interface (SCSI) connection, a Universal Serial Bus (USB) connection or other wired or wireless, digital or analog interface or connection, mesh. The network 202 may be a network of data processing nodes that are interconnected for the purpose of data communication.

FIG. 1B is a schematic illustration of a system for visualization of 3D models of objects in a 2D environment. Specifically, as shown and described in more detail herein, a 2D environment may be provided including a 2D image. The 2D image 260 may be a photograph, line drawing or video. For example, the 2D image 260 may be a picture of a room or part of a room. The 2D image 260 may be a personalized image captured by a user's hand-held device or other computing device. In other examples, the 2D image may be saved or imported from a storage device on a remote server or other device.

Perspective and scale may be added to the 2D image 260. The perspective and scale may be saved as part of the image such that the 2D image is now a combined image 262 having both the 2D information and perspective and scale information associated with the 2D image.

In some examples and as described in more detail herein, walls may be selectively positioned within the image. Further, in some examples, a 3D object may then be positioned within the 2D image with perspective and scale overlay, combined image 262. The 3D object may be realistically positioned within the resulting image 264 based on the perspective and scale overlay information. Further, the 3D object may be positioned within resulting image 264 such that the 3D object may be perceived in three dimensions within the 2D environment.

FIG. 2 illustrates a block diagram for the engine for virtual visualization of 3D models of objects in 2D environment 300. The engine for virtual visualization of 3D models of objects in 2D environment 300 may include a receiving module 206, an importing module 208, a visualizing module 210, an adding scale and perspective module 211, a superimposing module 212, an object replacing module 214, a moving module 216, a modify object module 217, a spinning module 218, a saving module 224, an uploading module 226 and a purchasing module 228.

Although various modules of the engine for visualization of 3D models of objects in 2D environment 300 are shown together, the engine for visualization of 3D models of objects in 2D environment 300 may be implemented as a web service, via a distributed architecture, or within a cloud computing environment. The files created with this application may contain perspective, scale and 3D model information in addition to the 2D graphic background information. The files may be shared, or sent to, or opened on any user devices which may be configured to display these files.

The receiving module 206 may be configured to receive inputs from the user 120 regarding an import request. The import requests may include user-specified data regarding a 2D environment, such that the 2D environment may be used as a background environment for displaying one or more 3D models of objects. The importing module 208 may be configured to import the 2D environment. The 2D environment may be a 2D photograph of an interior space such as a living room, or a bedroom, or a kitchen space, or a bathroom, or a garage, or an office space, and such others. Additionally, the 2D environment may include existing graphical materials or graphical materials captured as a still image or a live feed image.

The visualizing module 210 may help the user 120 to visualize the imported 2D environment. The visualizing module 210 may be configured to receive a superimposing request from the user 120. The superimposing request may include object information data related to a 3D object.

The user 120 may select the 3D object from a library of 3D objects or from 3D objects imported or saved by the user, which the user may have customized or made changes to. The received superimposing request is passed to the superimposing module 212, which superimposes the selected 3D object, based on the superimposing request onto the 2D environment.

A non-limiting example of a 3D object may be a display. The display may be any of a television, monitor, computer monitor, or visual array including, but not limited to, a liquid crystal display (LCD), light emitting diode (LED) display, organic light emitting diode (OLED) display, cathode based display, or any other display device capable of providing a visual image to a viewer. The display may be comprise any of a plurality of shapes, such as square, rectangular, curved, round, or any suitable geometric shape. Further, the display may include a support frame, may be frameless, or any other structural form factor known in the art. The display may be a stand-alone display or one of a plurality of display units comprising a composite display including multiple display units.

In addition, the visualizing module 210 may be further configured to receive a request for object replacement from the user. The object replacement request may include object information data or metadata encoding object information data including dimensions, or color, or material type of the 3D object selected from the library of 3D objects. The received object replacement request is passed to the object replacing module 214, which changes the object, based on the request. Additionally, the selected 3D object may be replaced by the user 120 with another 3D object. For example, the user may replace a large chair with a small chair in a 2D environment after visualizing both the large chair and the small chair in the 2D environment.

The visualizing module 210 may further help the user 120 to alter view settings such as brightness or contrast of the imported 2D environment. Altering the brightness or contrast of the 2D environment may allow the user to visualize the positioning of the 3D object in the 2D environment under more light or less light situations. For example, the user will be able to visualize and appreciate how the 3D object superimposed on the 2D environment may look during day time versus night time conditions, or conditions of bright lighting or dim lighting where a lamp or light fixture is being used. Additionally, the visualizing module 210 may also help the user with directional options, such as a compass or a north facing arrow to identify the orientation of the 2D environment. The user may prefer to have directional options for personal reasons, or aesthetic preference, or for daylight requirement needs.

The visualizing module 210 may be further configured to receive scale data (defining the scale of the 2D environment) and the perspective data (defining the perspective of the 2D environment) request from the user. The scale data and perspective data request is passed on to the adding scale and perspective module 211, which allows the user to adjust the scale and perspective of the 2D environment.

The method then moves on to the moving module 216. The moving module 216 may be configured to receive an object spinning request for rotational movement of the 3D object imported on to the 2D environment. The spinning request thus received is passed on to the spinning module 218, which allows spinning or any such rotational movement of the 3D object in the 2D environment. For example, the 3D object inserted onto the 2D environment might be a chair or triangular table, and the user may prefer to precisely orient the chair seat in a particular direction or in case of the triangular table, the user may prefer the three corners of the table oriented in a certain preferred directions.

The user may also modify one or more properties of the 3D object by changing the color, material, and/or dimensions of the 3D object. The modify object module 217 may be configured to receive a request to change one or more properties of the 3D object. For example, the modify object module 217 may receive the request to change the color of the framing of display to match a color of a wall within the two-dimensional environment. Upon receipt of the request, the modify object module 217 may change the color of the display framing to match the wall of the two-dimensional environment.

In addition to modifying physical properties of the 3D object, the modify object module 217 may be configured to change the behavior characteristics of the 3D object within the 2D environment. For example, a 3D object such as a chair may include behavior characteristics constraining the chair to positions on the floor of the 3D environment. Other 3D objects such as a lamp, may be constrained to positions on the floor, on a desk, a wall ledge, etc. Additional behavior characteristics may include a minimum clearance space around the 3D object, mounting requirements for the 3D object, length of a power cord/power requirements, or any other suitable characteristic or constraint that may affect the positioning of the 3D model within a two-dimensional environment. The user may save the changes made to the 3D object to a local library of 3D objects or the changes may be saved to remotely stored 3D object library.

As the user finalizes the appropriate color, material, positioning and spinning of the selected 3D object within the 2D environment, the resulting image may be uploaded to a social network website, microblogging service, blog or any other website resources by the uploading module 226. Thereby, the user 120 may receive inputs from contacts such as family members or friends regarding the resulting image formed by the 3D object placement in the 2D environment. With appropriate inputs, the user 120 may choose to alter the resulting image of the 3D object in the 2D environment. In addition, based on user request, the saving module 224 may save the resulting image for future use or reference. Alternatively, the user 120 may be highly satisfied with the overall look of the 3D object in the 2D environment and decide to purchase the 3D object. In such a situation the purchasing request is passed to the purchasing module, 228. In some embodiments, a contact of the user 120 via social networking websites in the web application 204, may request the user to purchase the 3D object in consideration.

Figure 3A:
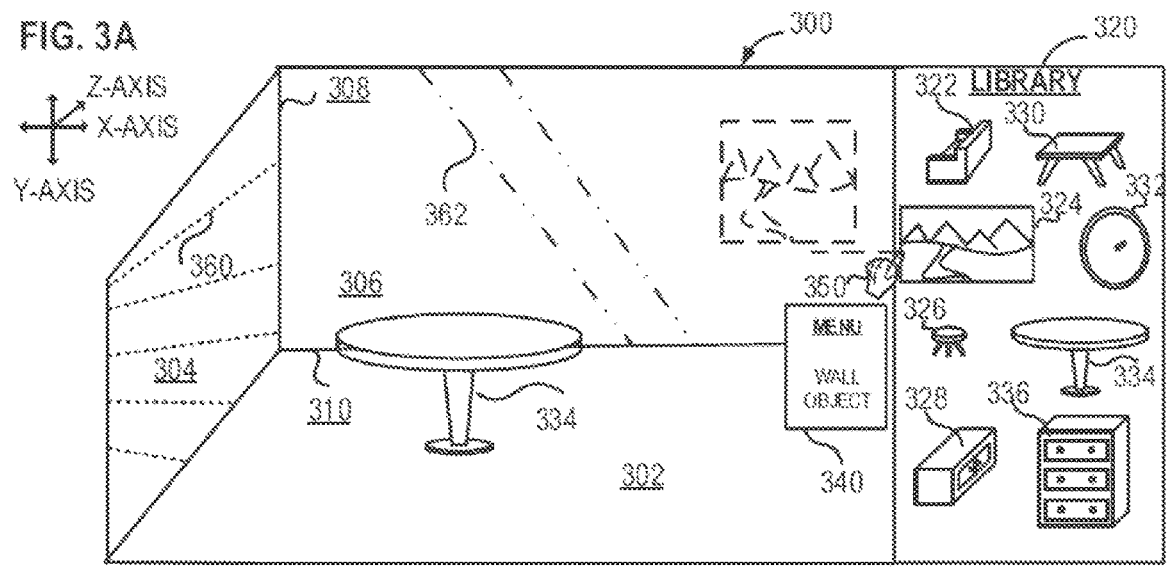

Turning now to FIGS. 3A, 3B, 3C and 3D. FIG. 3A illustrates an example 2D environment 300. The example 2D environment 300 may include an interior space bounded by a wall 304, a wall 306, an intersection 308 marking the intersection of the wall 304 and the wall 306. Further the 2D environment includes a ground plane 302 (e.g. a flooring surface). The example 2D environment may comprise of various objects such as a table 334, as illustrated in FIG. 3A. Each of the ground plane 102, wall 304, and wall 306 may include one or more properties including a total area property, an occupied area, and an unoccupied area.

Figure 3B:
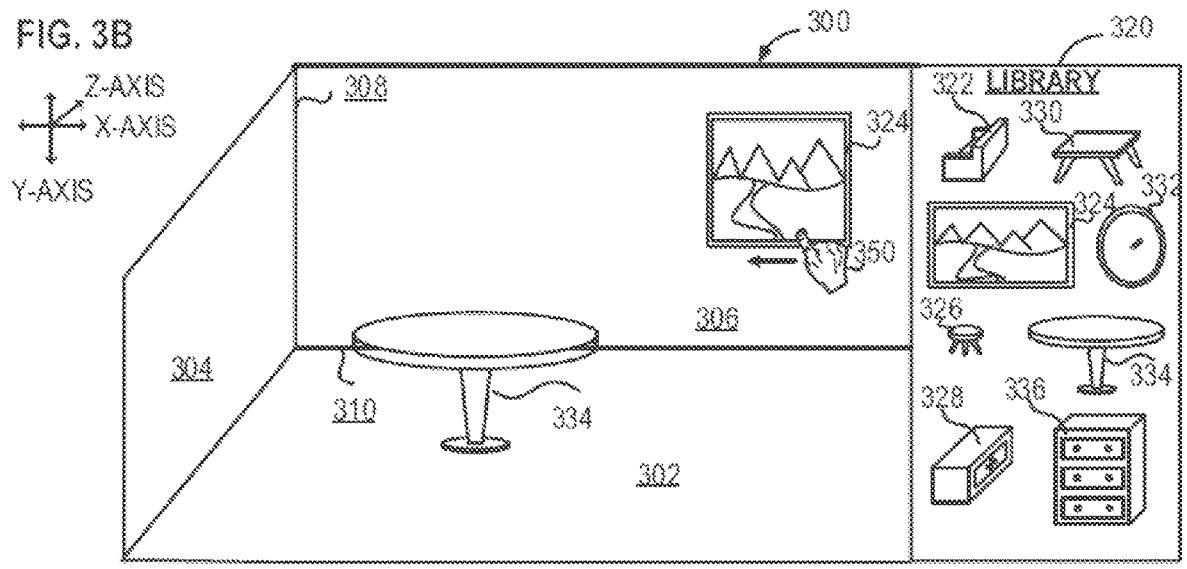

FIG. 3A further includes a library 320. The library 320 may include various 3D objects that may be imported onto the 2D environment 300. As shown in FIGS. 3A and 3B, the library includes a couch 322, the display 324, a step stool 326, a small drawer 328, a table 330, a wall mirror 332, the table 334 and a chest of drawers 336. The library 320 may include but not restricted to the items illustrated. Additionally, when the 3D object is selected, a menu bar may be displayed indicating if the object selected is a floor object, a wall object or a ceiling object. A finger icon 350 or other suitable indicator may be used to select an item from the library 320 and drag it to the 2D environment 300. Alternatively, the user may use key board, or touch pad, or mouse key on one of the user devices 130, to select and drag 3D objects onto the 2D environment 300. As illustrated in FIG. 3A, the finger icon 350 or other suitable indicator may select the display 324 from the library 320 and drag it onto the 2D environment 300. The dashed lines in FIG. 3A indicate the moving and positioning of display 324 from the library 320 to the 2D environment 300. As illustrated in FIG. 3A, once the display 324 is selected a menu bar 340 is displayed indicating the type of plane the 3D object belongs to. In this case the display 324 selected is a wall object. Alternatively, if the user desires to select the step stool 326 or the table 330, then the menu bar will display ground plane or floor object.

As illustrated in FIG. 3B, the finger icon 350 or other suitable indicator may move the display 324 along the wall 306, as indicated by the arrow next to the finger icon. The user 120 may move the display 324 horizontally along an x-axis or vertically along a y-axis on the wall 306. However, as shown in FIG. 3C, the user may continue moving the display 324 horizontally along the wall 306 to the intersection 308. The display 324 may be configured to halt at intersection of planes, in the example shown in FIG. 3C, the intersection 308 is the intersection between neighboring wall planes. As display 324 may be configured as wall object, it may be moved on to wall 304, as illustrated in FIG. 3D.

Conversely, in another example, the user 120 may decide to move the display down to the ground plane 302. In such an example, the display 324 may travel down to an intersection 310, formed between the wall 306 and the ground plane 302. The display 324, being a wall object, may be configured to move along the wall planes and not other planes, for example, the ground plane 302. This has the advantage of restricting the user from placing 3D objects in planes where the 3D objects do not belong.

In some examples, an indicator may be provided to indicate to a user appropriate surfaces for a select object. For example, if a wall object (such as a window, wall painting, hanging television display, etc.) is being positioned, potential walls for placement may be indicated by highlighting, flashing, color change, etc., such as schematically illustrated at 360. Similarly, if a floor object is being placed, floor planes may be indicated. Moreover, in some examples, a separate indicator, such as shown at indicator 362, may be used to indicate a plane that an object is currently positioned. For example, when a user selects the wall picture shown in FIG. 3A, indicator 362 may be displayed to provide information to a user regarding the current wall plane the object is positioned. Other potential locations (wall planes) may also light up with a same or different indicator (shown at 360).

The properties of the current wall plane and all other planes within the two-dimensional environment may be compared to the one or more parameters of the 3D object. If each of the properties of a plane match a corresponding parameter of the 3D object, the location within the plane may be identified as a potential location for the 3D object.

For example, a user may wish to move a wall painting as illustrated in FIGS. 4A-4C. Upon selection of the wall painting 532, parameters of the wall painting such as the length and width of wall painting 532 may be compared to the properties of wall 510 and the properties of wall 530. Example properties of wall 510 and wall 530 may include, but are not limited to an occupied area, an unoccupied area, length, and height, for example. Any area of wall 510 and wall 530 where the unoccupied area matches the length and width of wall painting 532 may be indicated to the user by a visual cue. Alternatively, movement of wall painting 532 to any area of wall 510 or wall 530 where any of the properties of the wall do not match the parameters of wall painting 532 may be prevented.

Such indicators may enable a user to easily readjust and position objects within the room. In some examples, potential positions may be selected based on additional or alternate parameters, such as size of the 3D object, electrical requirements for the 3D object, etc. For example, the size of the object may be a parameter which may be taken into account in indicating possible locations. Thus, a possible wall location indicator may not be displayed (in some examples) on a wall that is shorter than a selected wall object, such as a picture.

FIGS. 4A, 4B and 4C illustrate another example 2D environment, room 500. The room 500 may include an interior space bounded by a wall plane 510, a wall plane 530, a ground plane 540 (e.g. a flooring surface) and a top plane 520 (e.g. a ceiling surface). The room 500 may include a floor cabinet 546 and a light source 548. The floor cabinet 546 and the light source 548 are part of the room 500, and therefore may not be configured to be moved or controlled.

In other examples, light source 548 may be a 3D ceiling object and moveable within room 500. In this example, the user may select light source 548. Light source 548 may be classified as a ceiling object and include metadata limiting the positioning light source 548. Therefore, the user may position the light source on the top plane 520. The user may desire to move the ceiling object to various positions on the top plane 520. However if the user decides to move the ceiling object to the wall plane, such as the wall plane 510, the ceiling object may halt at the intersection 536 between the top plane 520 and the wall plane 510.

A 3D object such as a wall art 532 may be selected from a library such as the library 320 described in FIG. 3A, and superimposed onto the room 500 at position P1. The wall art 532 positioned on the wall plane 510 may be moved in a vertical manner such as along the y-axis, or horizontal manner such as along an x-axis, or a combination of both. As shown in FIG. 4B, the wall art 532 when moved in a horizontal manner along the X-axis, halts at the intersection 534 between the wall plane 510 and the wall plane 530 at position P2. At this point the user may decide to move the wall art further to wall plane 530 to position P3. As wall art 532 is configured to be a wall object, the user may move over the wall art 532 to the wall plane 530, as illustrated in FIG. 4C.

Alternatively, the user may decide to position the wall art 532 vertically along the Y-axis to the ceiling, top plane 520, the wall art 532 may be moved till an intersection 536, wherein intersection 536 is the intersection between the wall plane 510 and the top plane 520. The wall art 532 being a wall object may be configured to move on wall planes. As the user may attempt to move the wall art 532 to the top plane 520, the wall art 532 may halt at the intersection 536. Conversely, the user may select and drag a 3D ceiling object such a light fixture from the catalog to the room 500, representing the 2D environment. The user may position the ceiling object/light fixture on the top plane 520. The user may desire to move the ceiling object to various positions on the top plane 520. However if the user decides to move the ceiling object to the wall plane, such as the wall plane 510, the ceiling object may halt at the intersection 536 between the top plane 520 and the wall plane 510. Similarly, if the user decides to select and drag a floor object such as a chair from the library, such as the library 320 discussed in FIG. 3A, to the room 500, then the user may move the chair to various positions on the ground plane 540 but not on the wall plane 510, or the wall plane 530 or the top plane 520, and so forth.

Further still, FIGS. 4A, 4B and 4C include a menu bar 550 positioned at a periphery of the display. The menu bar 550 may aid a user to access various functions for customizing the 2D environment. In the example menu bar 550 shown in FIG. 4A, a first virtual button 552, a second virtual button 554, a third virtual button 556, a fourth virtual button 558, a fifth virtual button 560 and a sixth virtual button 562 are presented along the menu options in the menu bar 550. The first virtual button 552, which is labeled "Live Mode," may be selected by the user 120 to visualize a 2D environment with any of the user devices 130, discussed above. The "Live Mode" button allows the user 120 to switch between edit mode (where objects may be moved, edited and so forth) and a "live" mode where the end result is displayed.

The second virtual button 554, which is labeled "Create Walls," may be selected by the user 120 to form walls within the 2D environment. The third virtual button 556, which is labeled "Add Products," may be selected by the user 120 to add 3D objects to the room 500. These 3D objects may be obtained by the user 120 from the network 202 or from information sharing via social networking in the web applications 204. In one example, the user may select one or more 3D objects from a catalog of 3D objects from multiple vendors and 3D object sources to display in the 2D environment. The fourth virtual button 558, which is labeled "Undo," may be selected by the user 120 to undo a prior modification of the selected 3D objects, or a most recent selection of the 3D object. With respect to the example illustrated in FIG. 4B, if the user 120 is not satisfied with the positioning of the wall art 532 with respect to the floor cabinet 546, the user 120 may undo the movement of the wall art 532, as shown in the FIG. 4B. The fifth virtual button 560, which is labeled "Redo," may be selected by the user 120 to redo a movement of the 3D object that was recently performed. For example, if the user 120 is not satisfied with the positioning of the wall art 532 as shown in FIG. 4B, the user may undo the current positioning with the undo button, fourth virtual button 558, and may re-position the wall art 532 away from the floor cabinet 546, as shown in FIG. 4A, with the redo button, fifth virtual button 560, thereby redoing the previous position of the wall art 532.

Furthermore, the user 120 may save and share screenshots of the wall art 532 positioning with contacts such as family members or friends via the web applications 204 to seek their opinion. If one or more of the contacts share their opinion that the position of the wall art 532 away from the floor cabinet 546, as shown in FIG. 4A, is more aesthetically and practically satisfactory compared to the positioning of the wall art 532 near the floor cabinet 546, as shown in FIG. 4B, the user 120 may use the redo button, fifth virtual button 560, to return to the first positioning of the wall art.

The sixth virtual button 562, which is labeled "View Settings," may be selected by the user 120 to review the settings of the 2D environment, in this example, the room 500. In some embodiments, the user 120 may not be satisfied with the brightness of the 2D environment, the room 500 herein, and hence would prefer to adjust the brightness. In other embodiments, the user 120 may not be satisfied with the color contrast of the room 500 and would prefer to adjust the contrast settings. Additionally, the View Settings button, sixth virtual button 562 may provide the option of direction via a compass or a north pointing directional arrow. This may aid the user 120 in placing 3D objects in a particular preferred direction. Several users may have directional preference for placing of objects with respect to object material type and color and the directional aspect is hence very useful for such purposes.

If the user decides to superimpose an additional 3D object onto the 2D environment, the room 500, then the user may select another 3D object from a library, similar to the library 320 described in FIG. 3A. The user may access the library by clicking on or selecting the Add Products button, third virtual button 556, on the menu bar 550. The user may use one or more of the input devices of user devices 130 to access the Add Products button, third virtual button 556. The additionally selected 3D object may then be superimposed onto the 2D environment, the room 500.

FIG. 5 illustrates an example flowchart for a method 600 of placing and moving an object in the 2D environment. The method 600 may be performed by may be performed by processing logic that may comprise hardware (e.g., programmable logic, microcode, and so forth), software (such as computer code executable on a general-purpose computer system or a specifically configured computer system), or a combination of both. The processing logic resides at the engine 200 for virtual visualization of 3D models of objects in 2D environment, as illustrated in FIG. 2. The method 600 may be performed by the various modules discussed above with reference to FIG. 2. Each of these modules may comprise processing logic.

Method 600 begins at 610 where the user 120 may select a 3D object and the 3D object may be configured to be a wall object. In some examples, and as described in regards to FIG. 3, optionally at 611, a wall indicator may appear on the image where the user is selecting to position an object. The wall indicator may enable a user options for where to position an object. For example, potential wall planes may be highlighted if a wall object is selected. A current wall plane for the 3D object may further be indicated.

If the 3D object selected is configured to be a wall object, the method moves to operation 612. At operation 612, the 3D wall object may be placed relative to a wall plane. As discussed in FIGS. 3A-D and FIGS. 4A-C, the wall object once placed relative to the wall plane may be moved on the wall plane so as that the user may position the wall object at a position aesthetically and practically satisfactory. Additionally, the wall object may be moved from one wall plane to another as illustrated in FIG. 3D and FIG. 4C.

The selected 3D object may be configured to be a ceiling object or a floor object. The method then moves to operation 620. At operation 620, if the selected 3D object is a ceiling object then the user may position the 3D object relative to the top or ceiling plane. For example, the user may select a light fixture. The light fixture may be positioned on the top plane or ceiling plane. The user may move the light fixture to various positions in the top plane. However, the ceiling object may be moved in the ceiling plane and not in the wall plane. The user may drag the light fixture to the intersection of the wall plane and the ceiling plane, wherein the light fixture may halt at the intersection as the light fixture may be configured to be a ceiling object and therefore restricted to positioning in the ceiling plane. In some examples, optionally at 621, a ceiling indicator may appear on the image where the user is selecting to position an object.

If the selected 3D object is neither a wall object nor a ceiling object, the method 600 moves to operation 630. At operation 630, the selected 3D object may be configured to the ground plane or floor plane or so forth. The user 120 may position the selected 3D object at various positions relative to the ground plane. For example, if the selected 3D object is a dinner table, the user may position the dinner table on the ground plane. The user may move the dinner table to the intersection of a wall plane and the ground plane. The dinner table being a floor object may be restricted to the ground plane.

FIG. 6A illustrates an example flowchart for a method 800 of placing and moving an object in a modelled 2D environment. The method 600 may be performed by may be performed by processing logic that may comprise hardware (e.g., programmable logic, microcode, and so forth), software (such as computer code executable on a general-purpose computer system or a specifically configured computer system), or a combination of both. The processing logic resides at the engine 200 for virtual visualization of 3D models of objects in 2D environment, as illustrated in FIG. 2. The method 600 may be performed by the various modules discussed above with reference to FIG. 2. Each of these modules may comprise processing logic.

Method 800 begins at operation 810. At operation 810, the receiving module 206 may receive a request to superimpose 3D models of objects onto the 2D environment. A superimposing request may include a user selecting a 3D object from a library of 3D models of objects (in the engine for virtual visualization of 3D models of objects in 2D environment 300), from 3D models of objects saved or imported by the user, or 3D models of objects obtained from online resources.

The method then moves to operation 820. At operation 820, as discussed above in reference to FIG. 2, the moving module 216 may receive a request to move the 3D objects in the 2D environment. The request to move or reposition the 3D objects may include data on the selection of a direction by the user. As examples, the 3D objects may be moved in a vertical and/or horizontal direction. As another example, the 3D object may be rotated about a vertical, horizontal, and/or other rotational axis.

The 3D object may be positioned such that the object is fully positioned on a select plane. However, in some examples, the object may be positioned such that part of the object crosses onto a second plane. A threshold may be defined where if the object extends beyond the first plane a sufficient amount, then the object is switched to the second plane. Further, in some embodiments, if the object is positioned such that the object is primarily on the first plane (does not cross the threshold plane boundary), then the object may be prepositioned on the first plane such that the object does not overlap into the second plane. For example, at operation 830, if the 3D object superimposed on the 2D environment and positioned on a plane, wherein the plane may be a wall plane, a ground plane (e.g., a floor plane) or a top plane (e.g., a ceiling plane), does not completely cross the boundaries of the plane, then the method moves to operation 860 and the 3D object may remain in a position relative to the currently positioned plane. Any suitable range may be used to define a threshold plane boundary. As an illustrative example, and not as a limitation, the threshold boundary may be 20% of the object crosses to a second plane. Thus, if the object is placed such that over 20% of the object is on the second plane, then the plane may snap or be automatically positioned on the second plane. Although illustrated with a 20% threshold, any suitable threshold from 2-100% may be used.

At operation 830, if the 3D object superimposed on the 2D environment and positioned on a wall plane or a ground plane (e.g., a floor plane) or a top plane (e.g., a ceiling plane), crosses the boundaries of that plane, then the method 800 moves to operation 840 and the 3D object may be repositioned to a new plane.

If the 3D object is configured to belong to the new plane, then the method 800 moves to operation 870. At operation 870, the 3D object may be moved with the back surface of the object parallel relative to the new plane.

If the 3D object selected does not fit the new plane, then the method 800 moves to operation 850. At operation 850, the object may continue to remain in a position relative to the current plane.

FIG. 6B is a schematic illustration of positioning of a wall object relative to a selected wall plane within 2D environment 900 in accordance with an example embodiment. As illustrated, a user may select a wall object 902 for placement on a wall in the image. A user may first position the wall object 902 in a first position 906 on wall 904. In some examples, the position 906 may be a default position which is selected automatically when the wall object is selected. The user may then adjust the position of the wall object from the default position.

The user may move the wall object as indicated at 908. Once a threshold plane boundary is crossed, the object 902 may move to the second plane. However, in some examples, the plane may be of a size that is not compatible for the object, such as plane 912. Specifically, the size of the wall between edges 910 and 914 may prevent the wall object from fitting on the wall. The determination of whether an object may fit may be an automatic determination. In such examples, the object may pass, as indicated at 916 from wall 904 to a third plane wall 918. Wall object 902 may then be selectively positioned on wall 918 at indicated by second position 920.

In another embodiment, the threshold plane boundary may be adjusted. FIG. 6B illustrates an adjusted threshold plane boundary 922. The adjusted threshold plane boundary 922 may be located a distance from edge 914 based upon the one or more of the object information data and the environmental information data described above. For example, a 3D object corresponding to a ceiling light fixture may include object information data requiring installation of the ceiling light fixture at a minimum distance of three feet from the nearest wall of the two dimensional environment to minimize a potential fire hazard. In this example, the threshold boundary between the ceiling and the walls may be adjusted to three feet from the physical threshold boundary between the ceiling and the wall. Alternately, the 2D environment 900 may include environmental information data providing the location of sprinkler fixtures within the ceiling that require by federal, state, and local fire ordinances a minimum clear distance surrounding each sprinkler head of eight inches. In this case, an adjusted threshold boundary with an eight inch radius may be located around each sprinkler head and prevent movement of the ceiling light fixture to a location on the ceiling that would violate the fire ordinances.

In another example, a user may attempt to position an electrical panel within a two-dimensional room environment. The 3D object corresponding to the electrical panel may include object information data encoding mounting requirements, electrical power requirements, and a spatial requirement that the electrical panel may not be within 6 inches of any adjacent wall from the wall the electrical panel is mounted. The two-dimensional room environment may include environmental information data including construction requirements such as the location of the available power supplies to power an electrical panel and the environmental information data may further include a local construction ordinance specifying that an electrical panel may not be located within two feet of an adjacent wall. In this example, the adjusted threshold boundaries may be located two feet from the physical threshold boundary.

FIG. 7 shows an example electronic form of a computer system 700, within which is a set of instructions for causing a machine to perform any one or more of the methodologies discussed herein may be executed. The machine may be a PC, a tablet PC, a set-top box (STB), a PDA, a cellular telephone, a web appliance, a network router, switch or bridge, or any machine capable of executing a set of instructions (sequential or otherwise) that specify actions to be taken by that machine. In several example embodiments, the machine operates as a standalone device or may be connected to other machines (e.g., networked). In a networked disposition, the machine may operate in the capacity of a server or a client machine in a server-client network environment.

The example computer system 700 may be configured to include a processor or multiple processors 702 (e.g., a central processing unit (CPU), a graphics processing unit (GPU), or both), a main memory 704 and a static memory 706, which communicate with each other via a bus 708. The computer system 700 may further include a video display unit 710 (e.g., a liquid crystal display (LCD) or a cathode ray tube (CRT), and the like). The computer system 700 may also include an alphanumeric input device 712 (e.g., a keyboard, and the like), a cursor control device 714 (e.g., a mouse, touchpad, touchscreen, and the like), a disk drive unit 716 for reading computer readable medium (e.g., USB thumb drive, solid state memory drives, and the like), a signal generation device 718 (e.g., a speaker, and the like (e.g., network interface card, and the like), and a network interface device 720.

Further, the disk drive unit 716 may include a computer-readable medium 722, on which is stored one or more sets of instructions and data structures (such as instructions 724) embodying or utilized by any one or more of the methodologies or functions described herein. Additionally, the instructions 724 may also reside, completely or partially, within the main memory 704 and/or within the processors 702 during execution by the computer system 700. The main memory 704 and the processors 702 may also constitute machine-readable media. Further still, the instructions 724 may be transmitted or received over a network 726 via the network interface device 720 utilizing any one of a number of well-known transfer protocols (e.g., Hyper Text Transfer Protocol (HTTP)).

The computer-readable medium 722 may include a single medium or multiple media (e.g., a centralized or distributed database and/or associated caches and servers) that store the one or more sets of instructions. The term "computer-readable medium" may further include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. Further, "computer-readable medium" may further include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like.

It will be appreciated that the configurations and routines disclosed herein are exemplary in nature, and that these specific embodiments are not to be considered in a limiting sense, because numerous variations are possible. For example, the above technology can be applied to various 3D objects superimposed on various 2D environments. The subject matter of the present disclosure includes all novel and non-obvious combinations and sub-combinations of the various systems and configurations, and other features, functions, and/or properties disclosed herein.

The above-disclosed embodiments may be combined with one or more of the embodiments and disclosures in U.S. Provisional Patent Application No. 61/992,629 entitled "METHOD FOR PROVIDING SCALE TO ALIGN 3D OBJECTS IN 2D ENVIRONMENT" filed May 13, 2014, one or more of the embodiments and disclosures in U.S. Provisional Patent Application No. 61/992,759 entitled "METHOD FOR FORMING WALLS TO ALIGN 3D OBJECTS IN 2D ENVIRONMENT", filed on May 13, 2014, one or more of the embodiments and disclosures in U.S. Provisional Patent Application No. 61/992,719 entitled "METHOD FOR PROVIDING A PROJECTION TO ALIGN 3D OBJECTS IN 2D ENVIRONMENT", filed May 13, 2014, one or more of the embodiments and disclosures in U.S. Provisional Patent Application No. 61/992,746 entitled "METHOD FOR REPLACING 3D OBJECTS IN 2D ENVIRONMENT", filed May 13, 2014, and/or one or more of the embodiments and disclosures in U.S. Provisional Patent Application 61/992,665 entitled "METHOD FOR INTERACTIVE CATALOG FOR 3D OBJECTS WITHIN THE 2D ENVIRONMENT", filed May 13, 2014. The entire contents of each provisional application referenced herein are hereby incorporated by reference for all purposes. For example, and not as a limitation, the embodiments herein may be combined with the elements and features disclosed in Provisional Application No. 61/992,629, the embodiments herein may be combined with the elements and features disclosed in Provisional Application No. 61/992,759, in combination with one or more of the elements and features disclosed in Provisional Application No. 61/992,719, in combination with one or more of the elements and features disclosed in Provisional Application No. 61/992,746, and/or in combination with one or more of the elements and features disclosed in Provisional Application No. 61/992,665. These combinations may include one or more features disclosed in one or more of the referenced provisional applications, including combinations of embodiments disclosed herein with features shown in one, two, three, four, or five of the provisional applications.

Further, the entire contents of each concurrently filed application, U.S. Non-Provisional patent application Ser. No. 14/710,554 entitled "METHOD FOR PROVIDING SCALE TO ALIGN 3D OBJECTS IN 2D ENVIRONMENT" filed May 12, 2015, U.S. Non-Provisional patent application Ser. No. 14/710,557 entitled "METHOD FOR FORMING WALLS TO ALIGN 3D OBJECTS IN 2D ENVIRONMENT", filed on May 12, 2015, U.S. Non-Provisional patent application Ser. No. 14/710,560 entitled "METHOD FOR PROVIDING A PROJECTION TO ALIGN 3D OBJECTS IN 2D ENVIRONMENT", filed May 12, 2015, U.S. Non-Provisional Patent Application Ser. No. 14/710,565 entitled "METHOD FOR REPLACING 3D OBJECTS IN 2D ENVIRONMENT", filed May 12, 2015 and/or U.S. Non-Provisional patent application Ser. No. 14/710,569 entitled "METHOD FOR INTERACTIVE CATALOG FOR 3D OBJECTS WITHIN THE 2D ENVIRONMENT", filed May 12, 2015, referenced herein are hereby incorporated by reference for all purposes.

The foregoing description is illustrative of particular embodiments of the invention, but is not meant to be a limitation upon the practice thereof.

The foregoing discussion should be understood as illustrative and should not be considered limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or steps plus function elements in the claims below are intended to include any structure, material or acts for performing the functions in combination with other claimed elements as specifically claimed.

Finally, it will be understood that the articles, systems, and methods described hereinabove are embodiments of this disclosure—non-limiting examples for which numerous variations and extensions are contemplated as well. Accordingly, this disclosure includes all novel and non-obvious combinations and sub-combinations of the articles, systems, and methods disclosed herein, as well as any and all equivalents thereof.

The invention claimed is:

1. A method, comprising:
   displaying a virtual object in a virtual environment, wherein the virtual object is virtually contacting a first virtual plane of the virtual environment;
   displaying:
      a first visual indication indicating a first area along the first plane that the virtual object is allowed to be moved to in accordance with both a first parameter of the virtual object that includes one or more size dimensions of the virtual object and a second parameter of the virtual object that includes one or more constraints for placing the virtual object onto one or more planes of the virtual environment; and
      a second visual indication indicating a second area along the first plane that the virtual object is prohibited to be moved to in accordance with both the first parameter and the second parameter, wherein the second area is at least partially bounded by the first area;
   in response to receiving a first user input to move the virtual object along a first path from a first location in the first area to a second location in the first area without the first path traversing into the second area, displaying the virtual object at the second location in the first area; and
   in response to receiving a second user input to move the virtual object along a second path from the first location in the first area to a third location in the second area, halting the movement of the virtual object at the intersection of the first area and the second area along the second path.

2. The method of claim 1, wherein the one or more constraints include one or more of a minimum clearance space around the virtual object, mounting requirements for the virtual object, and a length of a power cord of the virtual object.

3. The method of claim 1, further in response to receiving the first user input:
   receiving a first property of the first plane comprising an unoccupied area of the first plane;
   comparing the first parameter or the second parameter of the virtual object to the first property of the first plane; and
   displaying the first visual indicator when the first parameter or the second parameter matches the first property of the first plane.

4. The method of claim 3, wherein the first property comprises a width and a length of the first area.

5. The method of claim 4, further comprising in response to receiving the first input:
   receiving a first property of the first plane comprising an unoccupied area of the first plane;
   comparing the first parameter or the second parameter of the virtual object to the first property of the first plane; and
   displaying the second visual indicator when the first parameter or the second parameter does not match the first property of the first plane.

6. A method, comprising:
   receiving a first user input to select a virtual object in a virtual environment, wherein:
      the virtual object comprises:
         a first parameter comprising one or more size dimensions of the virtual object; and
         a second parameter comprising one or more plane constraints for placing the virtual object on one more planes of the virtual environment;
      the virtual environment is a virtual room comprising:
         a first plane corresponding to a first wall of the virtual room;
         a second plane corresponding to a second wall of the virtual room; and
         a third plane corresponding to a floor of the virtual room; and
      the first plane, the second plane, and the third plane are orthogonal to one another; and
   in response to the first user input:
      displaying a first plane indicator superimposed onto the first plane of the virtual room in accordance to the first parameter and the second parameter, wherein:
         the first plane indicator indicates that the virtual object is virtually placed on the first plane; and
         the virtual object is displayed having a first perspective corresponding to the first plane; and
      displaying a second plane indicator superimposed onto the second plane of the virtual room in accordance to the first parameter and the second parameter, wherein the second plane indicator indicates a potential plane in the virtual environment for the virtual object to be placed;
   receiving a second user input to move the virtual object from the first plane to the second plane and cross over a first intersection between the first plane and the second plane;
   in response to receiving the second user input, placing the virtual object along the second plane in accordance the first parameter and the second parameter, wherein the virtual object is displayed having a second perspective corresponding to the second plane;
   receiving a third user input to move the virtual object from the first plane to the third plane and cross a second intersection between the first plane and the third plane; and
   in response to receiving the third user input, halting movement of the virtual object at the second intersection in accordance to the first parameter and the second parameter.

7. The method of claim 6, wherein the virtual object further comprises metadata defining the object as a wall object, a ceiling object, a floor object, or a combination thereof.

8. The method of claim 6, wherein:
   the first plane and the second plane intersect at a first threshold boundary; and
   in response to the virtual object crossing the first intersection, placing the virtual object along the second plane.

9. The method of claim 6, further in response to receiving the second user input, halting the movement of the virtual object at the first intersection.

10. The method of claim 6, wherein the first plane indicator and the second plane indicator are visually the same.

11. The method of claim 6, wherein the first plane indicator and the second plane indicator are visually distinct from one another.

12. The method of claim 6, further in response to receiving the second user input, maintaining the virtual object along the first plane when a first amount of the virtual object extends into the second plane and the first amount of the virtual object is less than a threshold amount of the virtual object.

13. The method of claim 12, wherein the placing the virtual object along the second plane when a second amount of the virtual object extends into the second plane and the second amount of the virtual object is equal to or greater than the threshold amount of the virtual object.

14. The method of claim 6, further in response to receiving the second user input, automatically placing the virtual object at a predefined location along the second plane.

15. The method of claim 14, further comprising:
a fourth user input to move the virtual object from the predefined location along the second plane to a desired location along the second plane; and
in response to the fourth user input, placing the virtual object at the desired location from the predefined location.

16. The method of claim 6, further in response to receiving the second input:
receiving:
a first property of each of the first plane, the second plane and the third plane corresponding to the first parameter; and
a second property of each of the first plane, the second plane and the third plane;
comparing:
the first parameter of the virtual object to the first property of each of the first plane, the second plane and the third plane; and
the second parameter of the virtual object to the second property of each of the first plane, the second plane and the third plane; and
displaying:
the first plane indicator when:
the first parameter and the first property of the first plane matches the first parameter; and
the second parameter and the second property of the first plane matches the second parameter; and
the second plane indicator when:
the first parameter and the first property of the second plane matches the first parameter; and
the second parameter and the second property of the second plane matches the second parameter.

17. The method of claim 16 further comprising, forgoing displaying a third plane indicator superimposed on the third plane when:
the first parameter and the first property of the third plane does not match the first parameter; or
the second parameter and the second property of the third plane does not match the second parameter.

18. A method, comprising:
displaying a first virtual object and a second virtual object in a virtual environment, wherein:
the first virtual object is a first furniture;
the second virtual object is a second furniture;
the virtual environment is a virtual room comprising a first plane;
the first plane is a floor of the virtual room corresponding to the first plane; and
the first virtual object and the second virtual object are virtually placed on the first plane;
receiving a first user input to move the first virtual object, along a first path, from a first location in the first virtual plane to a second location on the first virtual plane;
in response to receiving the first user input with the first path traversing the second virtual object, halting the movement of the first virtual object at the second virtual object; and
in response to receiving the first user input with the first path not traversing the second virtual object, moving the first virtual object from the first location to the second location on the first virtual plane.

19. The method of claim 18, wherein:
the second location is within a first predetermined threshold distance of the second virtual object; and
in response to receiving the first user input, halting the movement of the first virtual object at the first predetermined threshold distance of the second virtual object.

20. The method of claim 18, further comprising:
displaying a third virtual object on a second plane of the virtual environment, wherein the second location is within a second predetermined threshold of the third virtual object; and
in response to receiving the first user input, halting the movement of the first virtual object at the second predetermined threshold distance of the third virtual object.

* * * * *